United States Patent
Saito

(10) Patent No.: US 8,437,194 B2
(45) Date of Patent: May 7, 2013

(54) DRIVING METHOD OF SEMICONDUCTOR DEVICE

(75) Inventor: Toshihiko Saito, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 176 days.

(21) Appl. No.: 12/892,121

(22) Filed: Sep. 28, 2010

(65) Prior Publication Data

US 2011/0080788 A1    Apr. 7, 2011

(30) Foreign Application Priority Data

Oct. 1, 2009 (JP) ................. 2009-229404

(51) Int. Cl.
*G11C 11/34* (2006.01)

(52) U.S. Cl.
USPC ............ 365/185.18; 365/201; 365/189.011

(58) Field of Classification Search ............ 365/185.18, 365/201, 189.011
See application file for complete search history.

(56) References Cited

U.S. PATENT DOCUMENTS

| | | | |
|---|---|---|---|
| 5,321,699 A | 6/1994 | Endoh et al. | |
| 5,386,422 A | 1/1995 | Endoh et al. | |
| 5,469,444 A | 11/1995 | Endoh et al. | |
| 5,602,789 A | 2/1997 | Endoh et al. | |
| 6,333,872 B1 * | 12/2001 | Ouellette et al. | |
| 6,646,922 B2 | 11/2003 | Kato | |
| 6,768,680 B2 | 7/2004 | Kato | |
| 6,876,581 B2 | 4/2005 | Kato | |
| 6,947,327 B2 | 9/2005 | Kato | |
| 7,012,836 B2 | 3/2006 | Matsubara et al. | |
| 7,173,858 B2 | 2/2007 | Kato | |
| 7,372,737 B2 | 5/2008 | Kato | |
| 7,561,476 B2 | 7/2009 | Kato | |
| 7,719,872 B2 | 5/2010 | Kato | |
| 7,760,552 B2 | 7/2010 | Miyake et al. | |
| 2009/0273974 A1 | 11/2009 | Kato | |
| 2010/0195367 A1 | 8/2010 | Kato | |

FOREIGN PATENT DOCUMENTS

| | | |
|---|---|---|
| JP | 61-222093 | 10/1986 |
| JP | 62-128099 | 6/1987 |
| JP | 63-026900 | 2/1988 |
| JP | 01-253900 | 10/1989 |
| JP | 05-182474 | 7/1993 |
| JP | 2004-253079 | 9/2004 |

* cited by examiner

*Primary Examiner* — Son Dinh
*Assistant Examiner* — Nam Nguyen
(74) *Attorney, Agent, or Firm* — Nixon Peabody LLP; Jeffrey L. Costellia

(57) ABSTRACT

It is an object to reduce defects caused by reading wrong data by judging whether a storage state held in a non-volatile memory element is correct or not in the case where accumulation or discharge of electrons in/from a charge accumulation layer. A semiconductor memory circuit including a memory cell region and a test region and a control circuit are included in a semiconductor device of the present invention. In the control circuit, a first operation is performed for writing data to a memory cell, and writing a first storage state to a first region or writing a second storage state to a second region. Then, a second operation is performed for reading a first storage state or a second storage state from a first region and a second region. Further, a third operation is performed for reading data from the memory cell. Whether the third operation is correctly performed or not is judged in accordance with whether the first storage state is read from the first region or not or whether the second storage state is read from the second region or not in the second operation.

8 Claims, 15 Drawing Sheets

DRIVING METHOD OF SEMICONDUCTOR DEVICE

BACKGROUND OF THE INVENTION

1. Field of the Invention

The present invention relates to a driving method of a semiconductor device. The present invention relates to a driving method of a semiconductor device including a non-volatile memory element in which data can be written and erased.

Note that in this specification, a semiconductor device refers to a device which can function by utilizing semiconductor properties.

2. Description of the Related Art

Non-volatile memory elements are semiconductor elements which can hold data semi-permanently by electrical or physical operation. Non-volatile memory elements can hold a plurality of storage states utilizing the fact that the threshold voltage changes depending on the amount of charge accumulated in charge accumulation layers.

The threshold voltage of a non-volatile memory element is shifted in a positive direction when electrons are accumulated a lot in a charge accumulation layer, and shifted in a negative direction when electrons are discharged from the charge accumulation layer. The data of a non-volatile memory element is written or read by referring the threshold voltages thereof while applying voltage to wirings connected to the non-volatile memory element.

A semiconductor device including a non-volatile memory element read out data by referring the shift of a threshold voltage; however, it is possible that electrons are not sufficiently accumulated or discharged in/from a charge accumulation layer. When electrons are not sufficiently accumulated or discharged in/from a charge accumulation layer, a semiconductor device cannot correctly read out a storage state held in non-volatile memory elements (e.g., see Patent Document 1).

REFERENCE

[Patent Document 1] Japanese Published Patent Application No. 2004-253079

SUMMARY OF THE INVENTION

Description will be made about the case where charges are discharged from a charge accumulation layer of the non-volatile memory element, so that the threshold voltage of a non-volatile memory element is shifted in a negative direction. In this case, when a potential supplied to each wiring is unstable, charges are not sufficiently discharged from the charge accumulation layer of the non-volatile memory element and it is possible that a defect caused by reading wrong data occurs. Here, a graph in which a shift of threshold voltage is made to be visible is illustrated in FIGS. 6A to 6C. A problem occurring in the case where charges are not sufficiently discharged from a charge accumulation layer of a non-volatile memory element is described in more detail. Note that in the graphs of FIGS. 6A to 6C, the horizontal axis indicates a threshold voltage, and the vertical axis indicates the number of non-volatile memory elements. In addition, in the graphs of FIGS. 6A to 6C, in the case of a first storage state (also referred to as "1"), data of the threshold voltages of many elements is distributed in a higher threshold voltage side by a positive shift of the threshold voltage. Further, in the graphs of FIGS. 6A to 6C, in the case of a second storage state (also referred to as "0"), data of the threshold voltages of many elements is distributed in a lower threshold voltage side by a negative shift of the threshold voltage.

In the case where charges are accumulated in a charge accumulation layer of a non-volatile memory element, a lot of elements are distributed in the positive side of the threshold voltage as shown by a solid line 601 in FIG. 6A. Then, the number of elements is decreased by discharging charges of the charge accumulation layer and shifted as shown by a dot line 602, so that the normal operation is achieved. On the other hand, in the case where a potential of each wiring is low in the operation of discharging charges of the charge accumulation layer, a decrease of threshold voltage is not enough in some cases, so that distribution of threshold voltage is shifted to the higher threshold voltage side (a dashed-and-dotted line 603 in FIG. 6A). Note that the case of FIG. 6A is not regarded as a reading error because data can be read as "0", whereby correct data can be output.

Further, in the case where a potential of each wiring is lower than that in FIG. 6A in the operation of discharging charges from a charge accumulation layer, a negative shift to the threshold voltage by the operation of discharging charges from a charge accumulation layer is not sufficient in some cases. Thus, in some cases, distribution of the threshold voltage is shifted to a positive side (a dashed-and-dotted line 604 in FIG. 6B). In the case of FIG. 6B, data can be read as neither "0" nor "1", so that the case of FIG. 6B is a reading error.

Further, in the case where a potential of each wiring is lower than that in FIG. 6B in the operation of discharging charges from a charge accumulation layer, a negative shift to the threshold voltage is not sufficient by the operation of discharging charges from a charge accumulation layer in some cases. Thus, in some cases, distribution of the threshold voltage is shifted to a positive side (a dashed-and-dotted line 605 in FIG. 6C). In the case of FIG. 6C, data "1 is read from a non-volatile memory element having data "0". The case of FIG. 6C is the most problematic because a reading error is not detected even when wrong data is read out.

Here, an object of one embodiment of the present invention is to provide a driving method of a semiconductor device in which defects caused by reading wrong data are reduced by judging whether a storage state held in a non-volatile memory element is correct or not in the case where accumulation or discharge of electrons is not enough.

One embodiment of the present invention is a driving method of a semiconductor device including: a semiconductor memory circuit which includes a memory cell region in which a plurality of memory cells for storing data of a first storage state or a second storage state is provided and a test region including a first region for holding the first storage state and a second region for holding the second storage state; and a control circuit for writing or reading data to/from the memory cells and the test region. In the control circuit, a driving method has steps of performing a first operation for writing data to one of the memory cells and writing the first storage state to the first region or writing the second storage state to the second region; performing a second operation for reading the first storage state and the second storage state from the first region and the second region; performing a third operation for reading the data from the memory cell; and judging whether the third operation is correctly performed or not in accordance with whether in the second operation, the first storage state is read from the first region or not or the second storage state is read from the second region or not.

Another embodiment of the present invention is a driving method of a semiconductor device including: a semiconductor memory circuit which includes a memory cell region in which a plurality of memory cells for storing data of a first storage state and a second storage state is provided and a test region including a first region for holding the first storage state and a second region for holding the second storage state; and a control circuit for writing or reading data to/from the memory cells and the test region. In the control circuit, a driving method has steps of: performing a first operation for writing data to one of the memory cells, writing the first storage state to the first region, and writing the second storage state to the second region; performing a second operation for reading the first storage state and the second storage state from the first region and the second region; performing a third operation for reading the data from the memory cell; and judging whether the third operation is correctly performed or not in accordance with whether in the second operation, the first storage state is read from the first region or not and the second storage state is read from the second region or not.

One embodiment of the present invention may be a driving method of a semiconductor device, in which the control circuit includes a row decoder and a column decoder, the first region or the second region is selected for every wiring connected to the column decoder, and the first operation to the third operation are performed.

One embodiment of the present invention may be a driving method of a semiconductor device, in which the control circuit includes a row decoder and a column decoder, the first region and the second region are selected for every wiring connected to the row decoder, and the first operation to the third operation are performed.

One embodiment of the present invention a driving method of a semiconductor device, in which the memory cell may be includes a switching transistor and a non-volatile memory transistor, and a power supply voltage generated based on a radio signal received by an antenna is supplied to a wiring for driving the switching transistor and the non-volatile memory transistor.

By one embodiment of the present invention, it is possible to provide a driving method of a semiconductor device in which defects of reading wrong data are reduced by judging whether a storage state held in a non-volatile memory element is correct or not in the case where accumulation or discharge of electrons is not enough.

DETAILED DESCRIPTION OF THE INVENTION

Embodiments of the present invention will be described with reference to the drawings. Note that the present invention is not limited to the following description, and it will be easily understood by those skilled in the art that various changes and modifications can be made without departing from the spirit and scope of the present invention. Therefore, the present invention should not be construed as being limited to the following description of the embodiments.

Embodiment 1

Figure 1A:
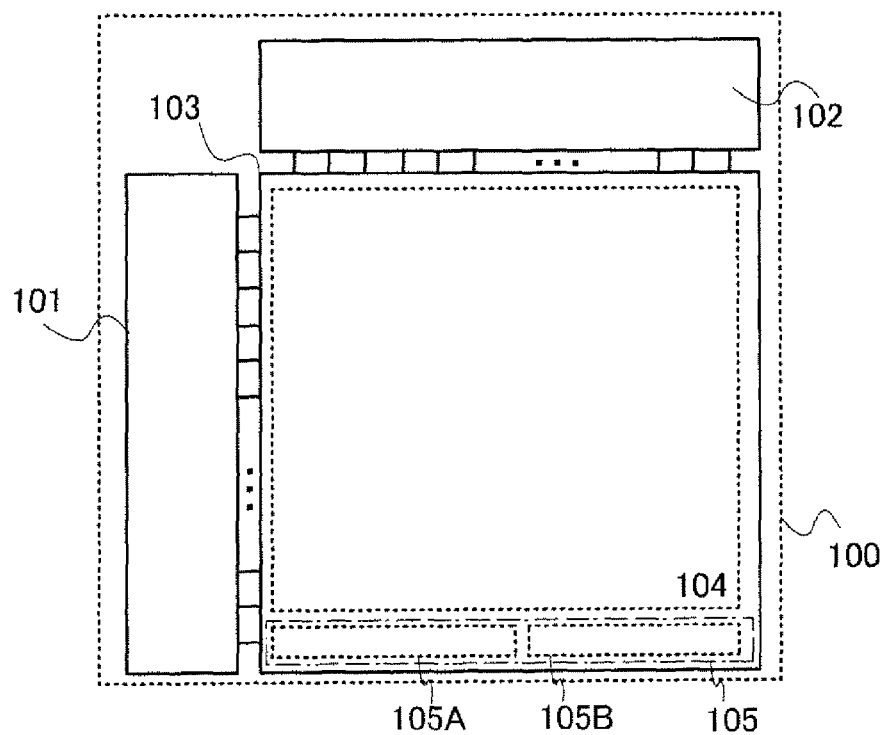
FIGS. 1A and 1B are block diagrams illustrating Embodiment 1.
Figure 1B:
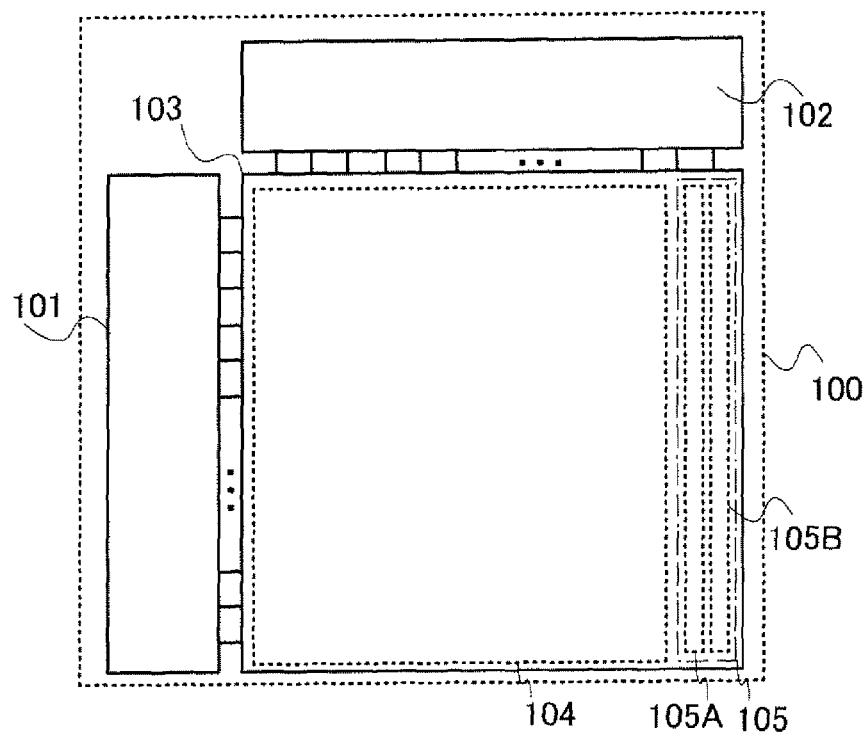

First, an example of a structure of a memory cell region (also referred to as a memory cell array) and a control circuit (also referred to as a driver circuit) which are included in a semiconductor device is illustrated in FIGS. 1A and 1B. A semiconductor device 100 in FIGS. 1A and 1B includes a row decoder 101, a column decoder 102, and a semiconductor memory circuit 103. The semiconductor memory circuit 103 includes a memory cell region 104 in which memory cells each including a non-volatile memory element are arranged in matrix, and a test region 105.

The test region 105 includes a first region 105A and a second region 105B. Note that FIG. 1A illustrates a structure in which the test region 105 is provided in parallel to the column decoder 102 such that the first region 105A and the second region 10513 in the test region 105 are controlled by one word line and selection line which are extended from the row decoder 101. That is, a memory cell is connected to the first region 105A or the second region 105B through a pair of bit line and source line extended from the column decoder 102.

FIG. 1B illustrates a structure in which the test region 105 is provided in parallel to the row decoder 101 such that the first region 105A and the second region 105B in the test region 105 are controlled by different word lines which are extended from the row decoder 101. That is, a memory cell is connected to the first region 105A and the second region 105B through a pair of word line and selection line extended from the row decoder 101. Further, although not illustrated in FIGS. 1A and 1B, a plurality of memory cells for storing data of the first storage state and the second storage state is provided in the memory cell region 104.

Note that terms such as first, second, third to Nth (N is a natural number) seen in this specification are used in order to avoid confusion between components and do not set a limitation on number.

Note that, the row decoder 101 and the column decoder 102 control writing and reading to/from non-volatile memory elements in the memory cell region 104 and non-volatile memory elements in the test region 105. Thus, the row decoder 101 and the column decoder 102 are collectively referred to as a control circuit in some cases. The row decoder 101 is connected to a word line (also referred to as WL) and a selection line (also referred to as SEL), and is a circuit for controlling the potential of the word line and the selection line. Further, the column decoder 102 is connected to a bit line (also referred to as BL) and a source line (also referred to as SL), and is a circuit for controlling the potential of the bit line and the source line.

Note that various kinds of semiconductor layers can be used for a semiconductor layer of a transistor included in the row decoder 101, the column decoder 102, the memory cell region 104, and the test region 105. For example, a semiconductor layer including a non-single-crystal semiconductor typified by amorphous silicon, polycrystalline silicon, micro-crystalline (also referred to as micro crystal or semi-amorphous) silicon, or single crystal silicon, or the like can be used. Note that in the case where an element is formed using a thin film semiconductor layer, the element can be formed at lower temperature compared to the case of using single crystal silicon. As the result, a reduction in manufacturing cost or an increase in size of a manufacturing apparatus can be achieved.

Note that the first storage state and the second storage state each indicate one of a plurality of storage states made by utilizing a difference in the shift of a threshold voltage which depends on the amount of charge accumulated in a charge accumulation layer of a non-volatile memory element provided in a memory cell. As an example, a state in which a large number of electrons are accumulated in a charge accumulation layer, that is, a storage state in which the threshold voltage is shifted to the positive side is referred to as the first storage state (also referred to as "1"); and a state in which electrons are discharged from a charge accumulation layer, that is, a storage state in which the threshold voltage is shifted to the negative side is referred to as the second storage state (also referred to as "0"). Note that in a so-called multi-valued non-volatile memory element which can have a plurality of storage states other than the first storage state and the second storage state, two arbitrary storage states are also referred to as the first storage state and the second storage state.

Note that the test region 105 includes memory cells each having a non-volatile memory element in a row direction and/or a column direction similarly to the memory cell region 104. However, the test region 105 is different from the memory cell region 104 in that a non-volatile memory element in the test region 105 has a first region and a second region in which a storage state to be held is previously determined. Specifically, the first region is a region for holding the first storage state and the second region is a region for storing the second storage state.

Next, the structure of FIG. 1A will be described more specifically with reference to FIGS. 2A and 2B and a structure of this embodiment will be described.

Figure 2A:
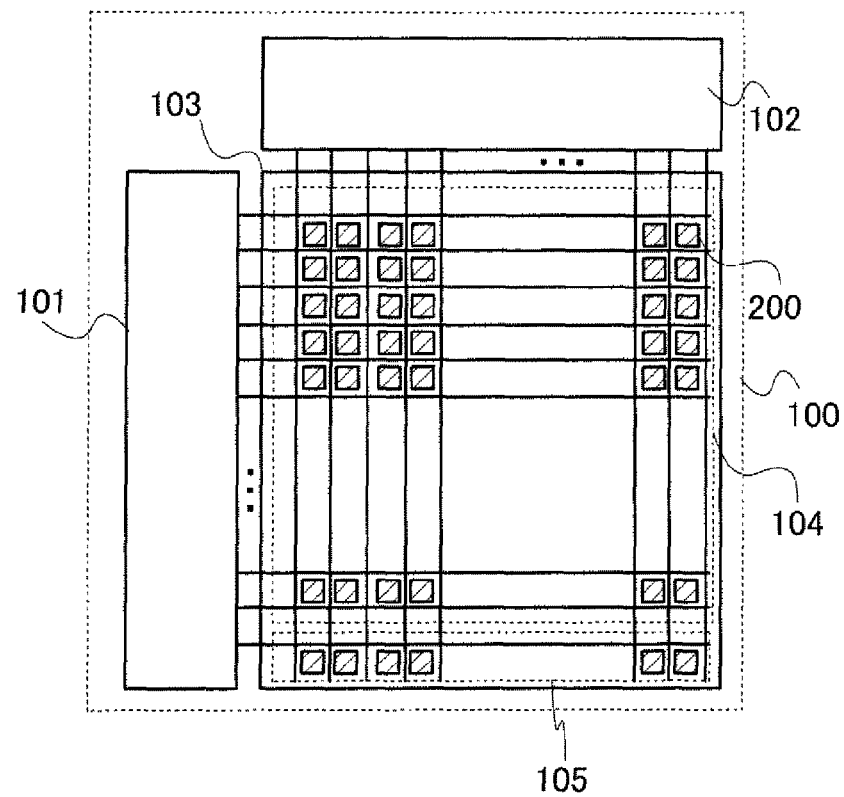
FIG. 2A is block diagram and FIG. 2B is a circuit diagram illustrating Embodiment 1.

FIG. 2A specifically illustrates memory cells in the memory cell region and the test region in FIG. 1A. FIG. 2B illustrates a specific circuit structure of a memory cell. Here, a memory cell includes a switching transistor and a non-volatile memory transistor as a non-volatile memory element.

The semiconductor device 100 illustrated in FIG. 2A includes the row decoder 101, the column decoder 102, and the semiconductor memory circuit 103 including the memory cell region 104 and the test region 105 as in FIG. 1A. The memory cell region 104 and the test region 105 include memory cells 200 arranged in matrix. As an example, FIG. 2A illustrates a structure in which the memory cells 200 are arranged in a grid pattern. Note that as illustrated in FIG. 1A, memory cells of the test region 105 are provided such that the memory cells in the first region and the second region of the test region 105 are controlled by one word line extended from the row decoder 101.

Note that FIG. 2A illustrates an example in which the memory cells 200 in the memory cell region 104 and the test region 105 are provided on a plan surface in a grid pattern. However, the memory cells 200 in the memory cell region 104 and the test region 105 may be provided so as to be stacked in three dimensions.

Figure 2B:
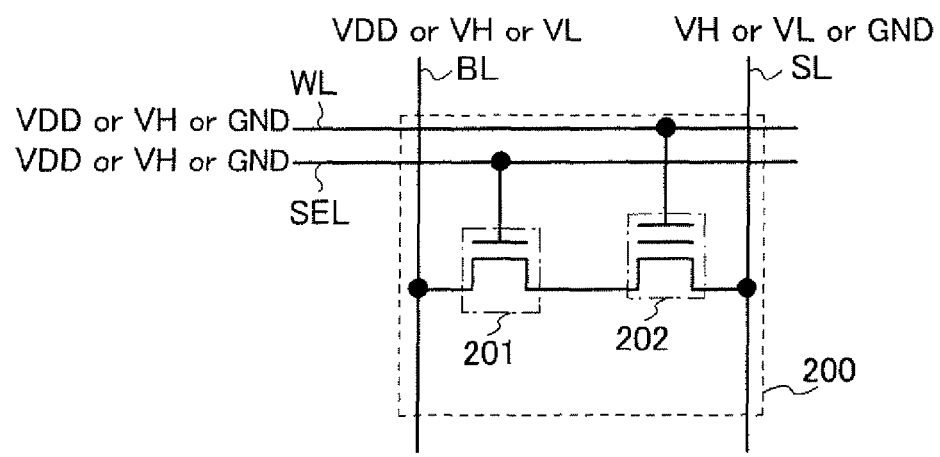

Further, a structure of the memory cell 200 illustrated in FIG. 2B is the following: a switching transistor 201 controlled by the word line WL, the selected line SEL, the bit line BL, and the source line SL and a non-volatile memory transistor 202 are included in the memory cell 200.

The word line WL is a wiring which is connected to a gate of the non-volatile memory transistor 202 and to which a high power supply potential VDD, an H signal VH, and a ground potential (also referred to as a low power supply potential) GND are supplied. The selection line SEL is a wiring which is connected to a gate of the switching transistor 201 and to which the high power supply potential VDD, the H signal VH, and the ground potential (also referred to as the low power supply potential) GND are supplied. The bit line BL is a wiring which is connected to a first terminal of the switching transistor 201 and to which the high power supply potential VDD, the H signal VH, and an L signal VL are supplied. The source line SL is a wiring which is connected to a second terminal of the non-volatile memory transistor 202 and to which the H signal VH, the L signal VL, and the ground potential (also referred to as the low power supply potential) GND are supplied. Further, a second terminal of the switching transistor 201 and a first terminal of the non-volatile memory transistor 202 are connected to each other. Note that the relation of the potentials which are supplied to the wirings is: VL<GND<VDD<VH.

Note that in this specification, when it is described that "A and B are connected to each other", the case where A and B are electrically connected to each other is included in addition to the case where A and B are directly connected to each other. Here, the description that "A and B are electrically connected to each other" expresses the following situation: when an object having any electrical function exists between A and B, A and B have substantially the same potential through the object.

Note that in this specification, a transistor is an element having at least three terminals of gate, drain, and source. The transistor includes a channel region between a drain region and a source region, and current can flow through the drain region, the channel region, and the source region. Here, since the source and the drain of the transistor change depending on the structure, operating conditions, and the like of the transistor, it is difficult in some cases to define which is a source or a drain. Accordingly, in this embodiment, one of the regions which function as a source and a drain is referred to as a first terminal and the other region is referred to as a second terminal in some cases. Further, a terminal which functions as a gate is simply referred to as a gate in some cases.

Note that a voltage in each wiring, which is described in this specification, corresponds to a potential difference with a ground potential GND used as a reference voltage. Accordingly, a voltage is referred to as a potential or a potential is referred to as a voltage in some cases.

Figure 3A:
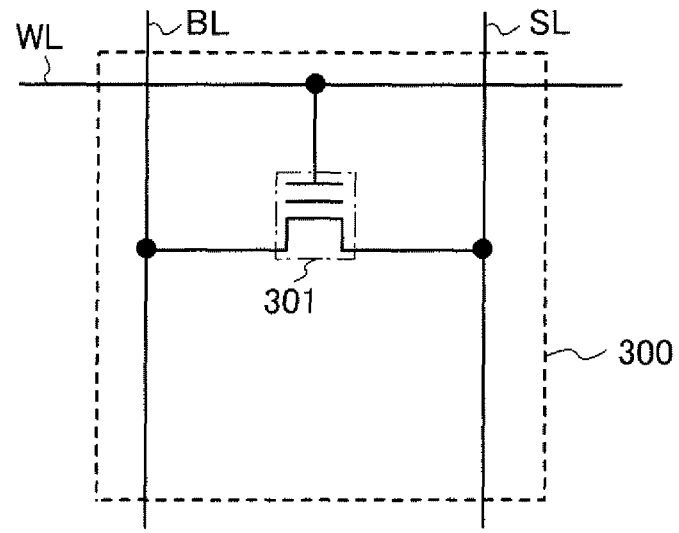
FIGS. 3A and 3B are circuit diagrams illustrating Embodiment 1.
Figure 3B:
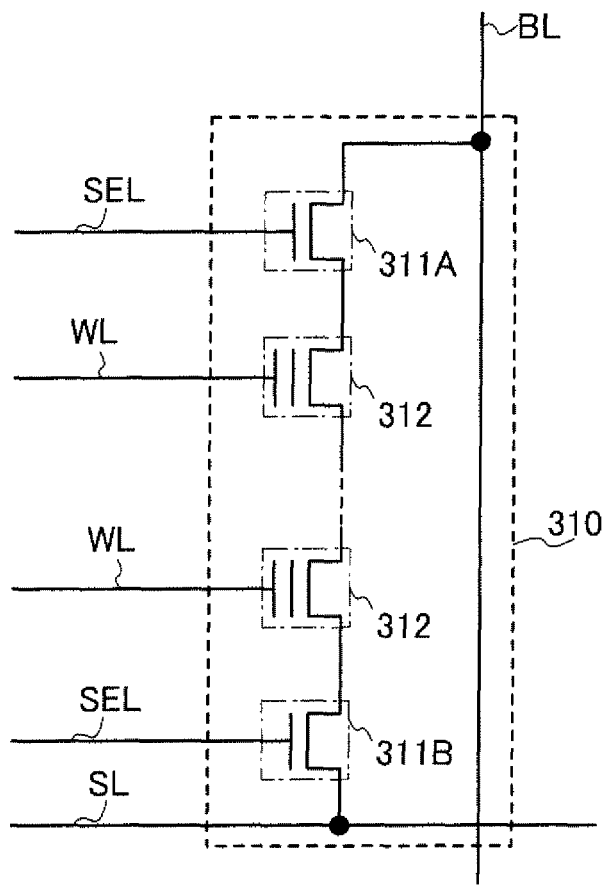

Note that FIG. 2B illustrates a structure in which a memory cell includes a switching transistor and a non-volatile memory transistor. However, the other structure including a flash memory or the like is also acceptable. A so-called NOR memory cell illustrated in FIG. 3A may be also used. A memory cell 300 illustrated in FIG. 3A includes a non-volatile memory transistor 301 and each terminal of the memory cell 300 is connected to the bit line BL, the source line SL, and the word line WL. In addition, a NAND memory cell illustrated in FIG. 3B may be also used. A memory cell 310 illustrated in FIG. 3B has a structure in which switching transistors 311A and 311B controlled by the selection line SEL, and a plurality of non-volatile memory transistors 312 controlled by the word line WL is included and terminals of the switching transistors are connected to the bit line BL and the source line SL.

Note that in the memory cell region 104, for example, (m×n) memory cells may be provided in matrix so that m cells are arranged in column and n cells are arranged in row. In addition, coordinates of the memory cells are referred to as (MC(1, 1) to MC(m, n)) (m and n are both natural numbers) in some cases.

Note that a non-volatile memory transistor is an element which can semi-permanently store data by application of electrical or physical action. Non-volatile memory transistors are roughly classified into a floating-gate (FG) type, a metal-oxide-nitride-oxide silicon (MONOS) type, and a metal-nitride-oxide-silicon (MNOS) type depending on a difference of charge accumulation layers, and any of these types may be used.

Next, a driving method of the semiconductor device illustrated in FIG. 2A will be described more specifically with reference to FIG. 4A.

First, a driving method of the semiconductor device will be briefly described with reference to FIG. 4A.

Figure 4A:
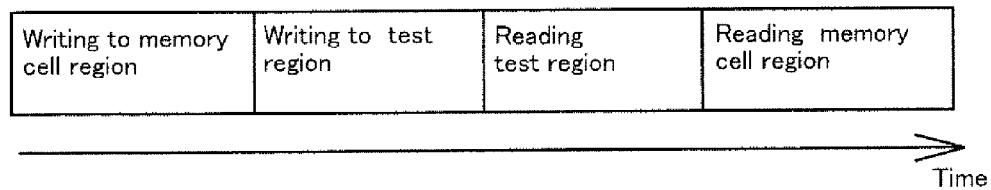
FIGS. 4A and 4B are diagrams for illustrating Embodiment 1.

As illustrated in FIG. 4A, data is written to the memory cell region. At this time, each memory cell holds the first storage state or the second storage state in accordance with the data written to the memory cell region. Then, data is written to the test region. At this time, writing to memory cells is performed such that the first storage state is held in the first region of the test region and the second storage state is held in the second region of the test region. Note that writing of data to a memory cell and writing of the first state and the second state to the test region are also referred to as a first operation.

Next, as illustrated in FIG. 4A, whether the first storage state or the second storage state from memory cells in the first region and the second region of the test region is held is read. Note that reading of the first storage state or the second storage state from the first region and the second region of the test region is also referred to as a second operation.

Then, as illustrated in FIG. 4A, data showing whether memory cells in the memory cell region hold the first storage state or the second storage state is read. Note that reading of data from memory cells in the memory cell region is also referred to as a third operation.

Note that the order of writing to the memory cell region and writing to the test region may be reversed.

Figure 4B:
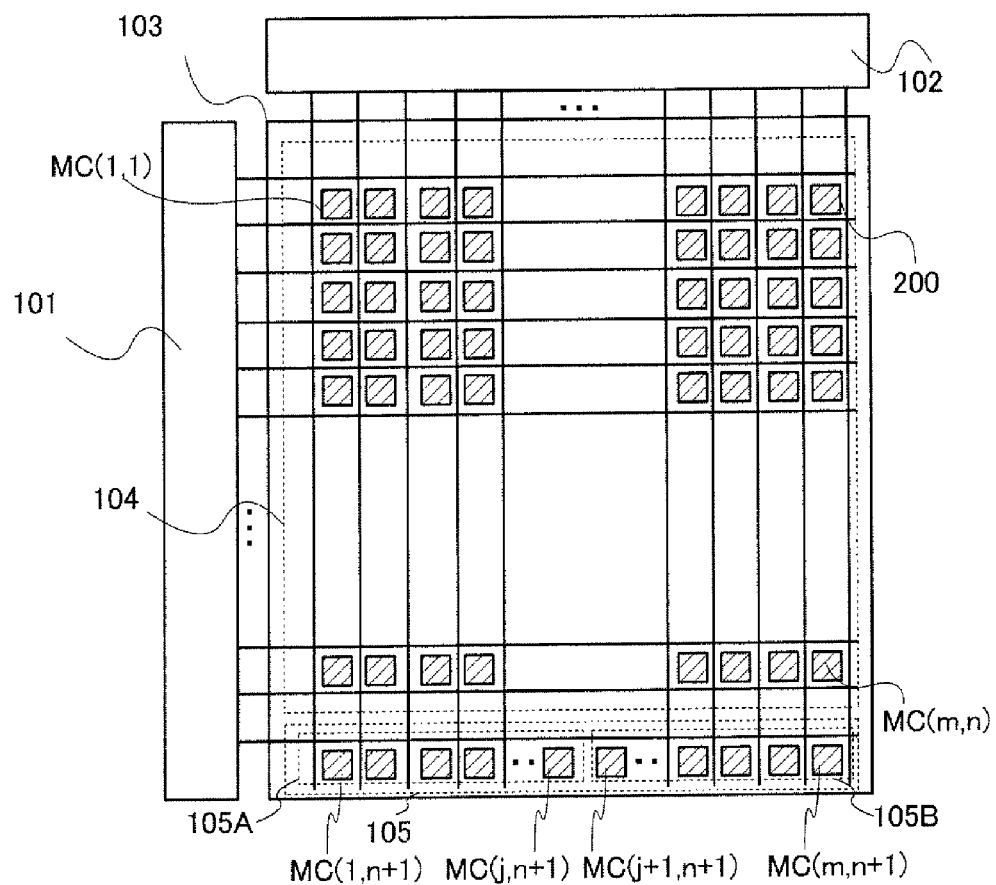

Note that as illustrated in FIG. 4B, as the first region 105A and the second region 105B in the test region 105, a region for holding the first storage state and a region for holding the second storage state may be separately provided. The size ratio of the first region 105A and the second region 105B is not particularly limited and any of the regions may be larger. That is, as illustrated in FIG. 4B, in the case where memory cells (MC(1, 1) to MC(m, n)) are provided in matrix, for example, the first region 105A for holding the first storage state is a region of MC(1, n+1) to MC (j, n+1) (j is a natural number satisfying 1<j<m), and the second region 105E for holding the second storage state is a region of MC (j+1, n+1) to MC (m, n+1).

Note that a signal for holding the first storage state in the first region 105A and a signal for holding the second storage state in the second region 105B which are signals written to the test region 105 may be a signal input to the semiconductor device subsequent to a signal of data written to the memory cell region 104. Alternatively, a signal generated in the semiconductor device at the time when a signal of data is supplied to the memory cell region may be used.

Next, a potential of each wiring is specifically illustrated in FIGS. 5A to 5D in order to roughly describe the driving method of the semiconductor device of this embodiment, which is performed when writing and reading of data to/from a memory cell.

Figure 5A:
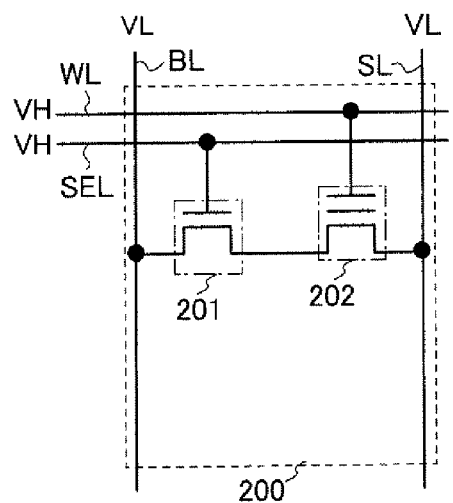
FIGS. 5A to 5D are circuit diagrams illustrating Embodiment 1.

First, FIG. 5A illustrates a potential state of each wiring in operation for accumulating charges in the non-volatile memory transistor 202 of the memory cell 200, that is, writing operation in which the non-volatile memory transistor 202 is made to be in the first storage state. In FIG. 5A, the H signal VH is supplied to the word line WL, the H signal VH is supplied to the selection line SEL, the L signal VL is supplied to the bit line BL, and the L signal VL is supplied to the source line SL. By the operation illustrated in FIG. 5A, charges are accumulated in the charge accumulation layer of the non-volatile memory transistor 202 and the threshold voltage of the non-volatile memory transistor 202 is increased.

Figure 5B:
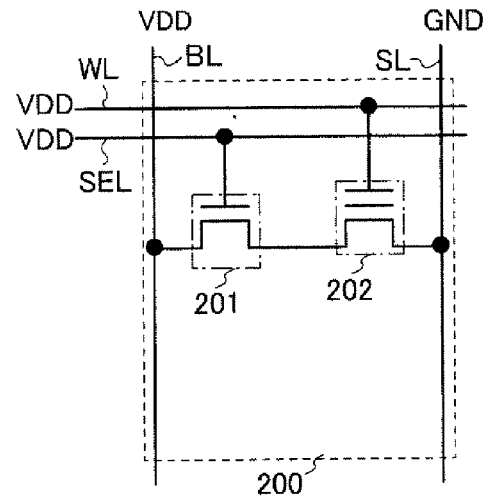

Then, FIG. 5B illustrates a potential state of each wiring in reading operation of the first storage state from the non-volatile memory transistor 202 of the memory cell 200, in which charges are accumulated. In FIG. 5B, the high power supply potential VDD is supplied to the word line WL, the high power supply potential VDD is supplied to the selection line SEL, the high power supply potential VDD is supplied to the bit line BL, and the ground potential GND is supplied to the source line SL. By the operation in FIG. 5B, in the case where charges are accumulated in the charge accumulation layer of the non-volatile memory transistor 202, since the threshold voltage of the non-volatile memory transistor 202 is increased, the source line SL and the bit line BL are not brought into conduction. Therefore, the potential of the bit line BL remains the high power supply potential VDD.

Figure 5C:
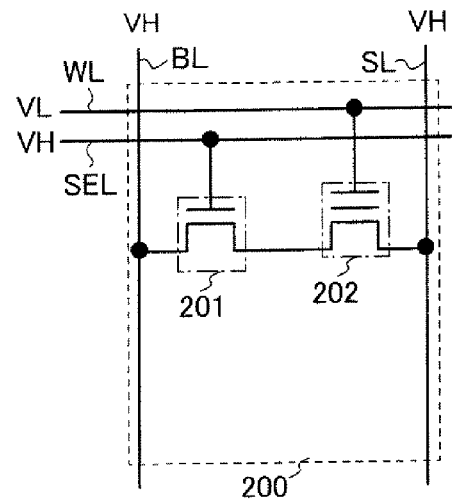

Then, FIG. 5C illustrates a potential state of each wiring in operation for discharging charges from the non-volatile memory transistor 202 of the memory cell 200, that is, writing operation in which the non-volatile memory transistor 202 is made to be in the second storage state. In FIG. 5C, the L signal VL is supplied to the word line WL, the H signal VH is supplied to the selection line SEL, the H signal VH is supplied to the bit line BL, and the H signal VH is supplied to the source line SL. By the operation illustrated in FIG. 5C, charges are discharged from the charge accumulation layer of the non-volatile memory transistor 202 and the threshold voltage of the non-volatile memory transistor 202 is decreased.

Figure 5D:
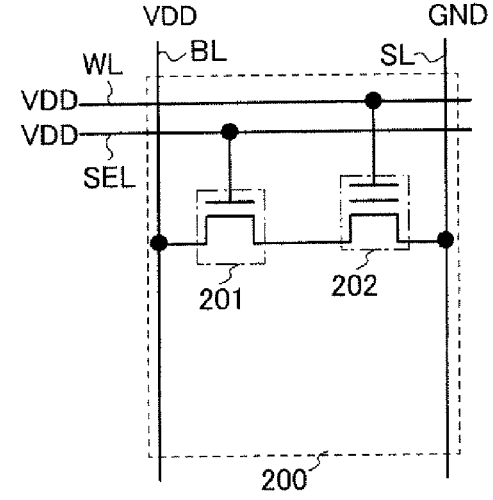

Then, FIG. 5D illustrates a potential state of each wiring in reading operation of the second storage state from the non-volatile memory transistor 202 of the memory cell 200, in which charges are not accumulated. In FIG. 5D, the high power supply potential VDD is supplied to the word line WL, the high power supply potential VDD is supplied to the selection line SEL, the high power supply potential VDD is supplied to the bit line BL, and the ground potential GND is supplied to the source line SL. By the operation in FIG. 5D, in the case where charges are not accumulated in the charge accumulation layer of the non-volatile memory transistor 202, since the threshold voltage of the non-volatile memory transistor 202 is decreased, the source line SL and the bit line BL are brought into conduction. Therefore, the potential of the bit line BL is decreased from the high power supply potential VDD to the ground potential GND.

That is, the potentials supplied to each of the word line WL, the selection line SEL, the bit line BL, and the source line SL illustrated in FIG. 2B may have any relation as long as the above described operation illustrated in FIGS. 5A to 5D can be performed.

Figure 6A:
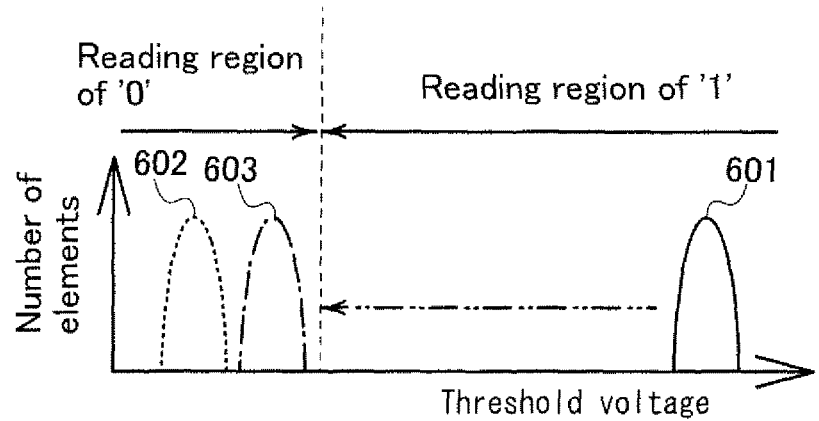
FIGS. 6A to 6C are diagrams illustrating a shift of a threshold voltage.
Figure 6B:
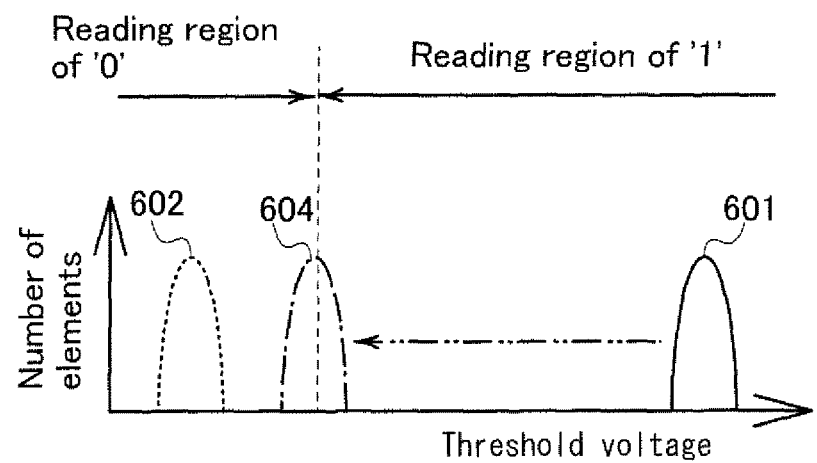
Figure 6C:
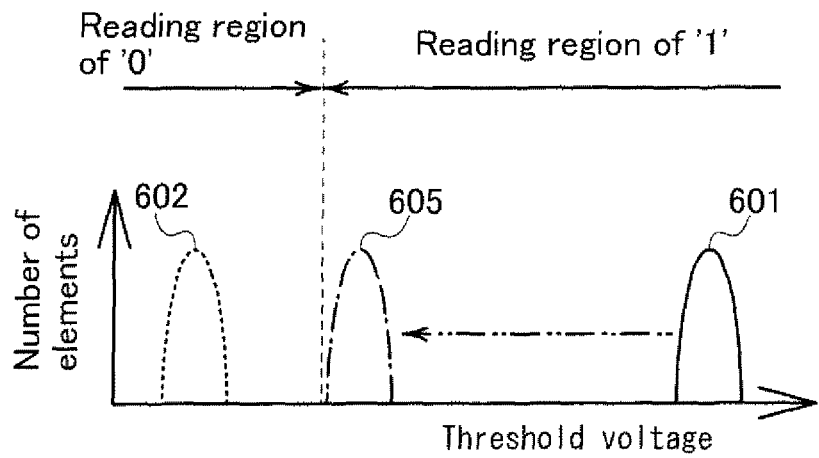
Figure 7:
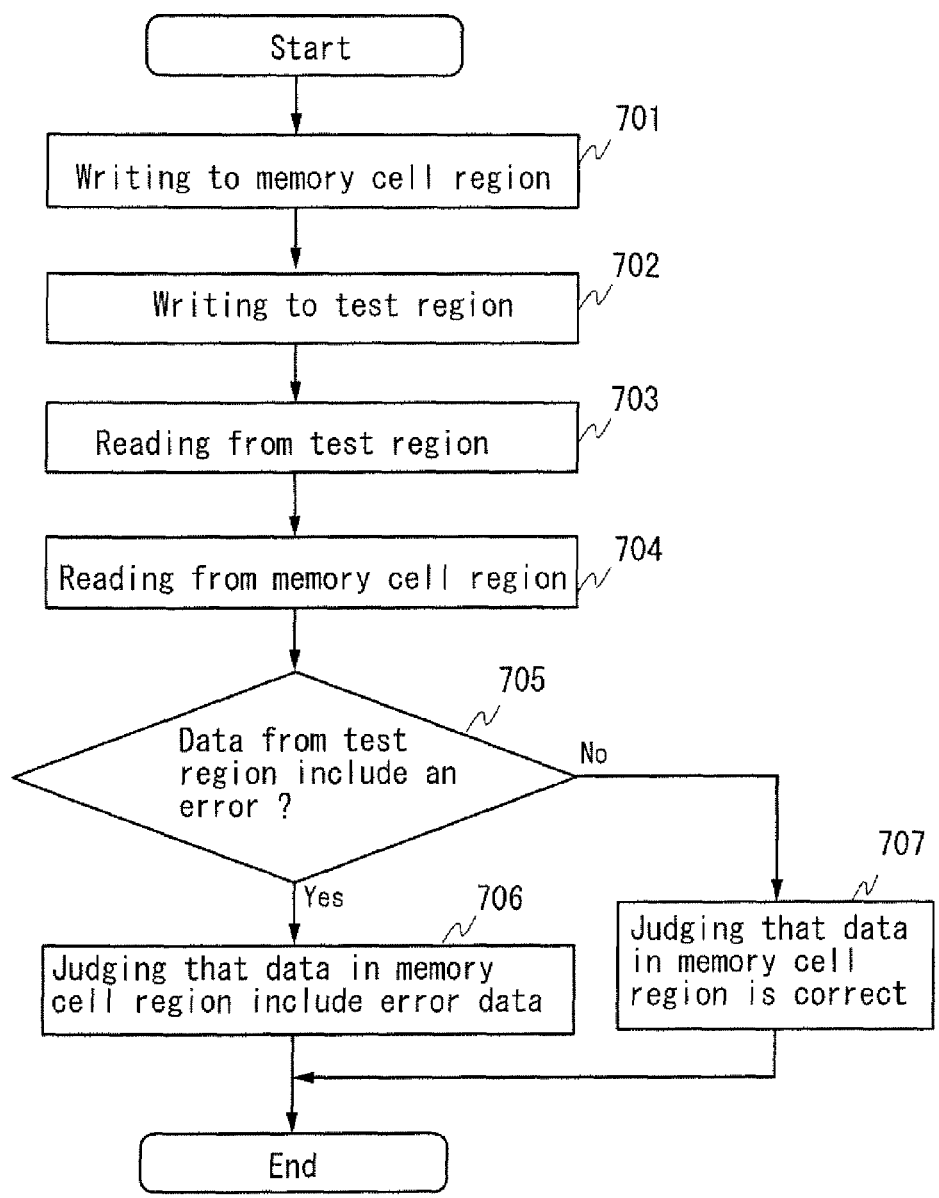
FIG. 7 is a flow chart illustrating Embodiment 1.

In the case of FIG. 5D in which data is read from the non-volatile memory transistor 202, the semiconductor devices of FIGS. 1A and 1B are driven in accordance with a flow chart of a driving method illustrated in FIG. 7 in order to judge whether data in the above-described states in FIGS. 6A to 6C is correct or not. Thus, it is possible to provide a driving method of a semiconductor device by which in the case where accumulation or discharge of charges in a charge accumulation layer is not performed sufficiently, whether a storage state held in a non-volatile memory element is correct or not is judged and defects of reading wrong data are decreased.

According to the flow chart illustrated in FIG. 7, first, data is written to the memory cell region. At this time, each memory cell holds the first storage state or the second storage state in accordance with the data written to the memory cell region (step 701).

Next, data is written to the test region. At this time, writing to memory cells is performed such that the first storage state is held in the first region of the test region and the second storage state is held in the second region of the test region (a step 702). Note that writing of data to the memory cell region and writing of data to the test region are performed for every bit line BL, that is, for every column. Therefore, for example, when data (the first storage state or the second storage state) is written to memory cells in the j-th column, data about the first storage state is written to the first region (a memory cell (j, n+1)) of the test region. The step 701 and the step 702 are collectively referred to as a first operation.

Note that as illustrated in FIG. 4B, as the first region 105A and the second region 105B in the test region 105, a region for holding the first storage state and a region for holding the second storage state may be separately provided. The size ratio of the first region 105A and the second region 105B is not particularly limited and any of the regions may be larger. That is, as illustrated in FIG. 4B, in the case where memory cells (MC(1, 1) to MC(m, n)) are provided in matrix, for example, the first region 105A for holding the first storage state ("0" in FIG. 4B) is a region of MC(1, n+1) to MC (j, n+1) (j is a natural number satisfying 1<j<m), and the second region 105B for holding the second storage state ("1" in FIG. 4B) is a region of MC (j+1, n+1) to MC (m, n+1).

Next, whether first storage state or the second storage state is held is read from memory cells in the first region or the second region of the test region (step 703). The step 703 is also referred to as a second operation.

Then, data showing whether memory cells in the memory cell region hold the first storage state or the second storage state is read (step 704). The step 704 is also referred to as a third operation. Note that data stored in a memory cell is read for every row. Therefore, for example, when reading data stored in a (n+1)th row, data stored in the first region of the test region connected to the (n+1)th row may be read first and then data may be read from a memory cell connected to the first row of the memory cell region.

Then, in reading from the test region performed in the step 703, whether data read from the first region is data of the first storage state or not or whether data read from the second region is data of the second storage state or not is judged (step 705). For example, before data (the first storage state or the second storage state) of memory cells in the j-th column is read, data of the first storage state is read from the first region of the test region (a memory cell (j, n+1)). Then, whether data read from the first region is data of the first storage state or not is judged.

In the step 705, it is judged that data stored in the memory region is error data in the case where data read from the first region is data of the second storage state or data read from the second region is data of the first storage state (step 706). That is, in the case where data of the first storage state held in the first region of the test region (a memory cell (j, n+1)) for the j-th column is judged as the second storage state because of insufficiency of accumulation or discharge of charges in/from a charge accumulation layer, data to a memory cell is judged as error data.

In the step 705, in the case where data read from the first region is data of the first storage state or data read from the second region is data of the second storage state, it is judged that data stored in the memory cell region is data stored correctly (step 707). In contrast to the step 706, in the case where data of the first storage state held in the first region of the test region (a memory cell (j, n+1)) for the j-th column is judged as the first storage state because of sufficiency of accumulation or discharge of charges in/from a charge accumulation layer, data to a memory cell is judged as data stored correctly.

That is, whether data of the memory cell region is correct or not can be judged by referring whether data written writing to the test region at the same time as writing to the memory cell region is correct or not. In other words, an effect can be obtained in that the minimum operating voltage can be lowered.

Note that the number of memory cells in the test region is not limited to that shown in this embodiment as long as the operation can be performed similarly to this embodiment. Although the test region 105 is provided at an end portion of the semiconductor memory circuit 103 in this embodiment, the test region 105 may be provided at other portions: for example, the test region 105 may be provided so as to divide the memory cell region.

Note that this embodiment can be combined with other embodiments as appropriate.

Embodiment 2

In this embodiment, a structure of FIG. 1B will be described with reference to FIG. 8 and FIG. 9. Note that description which overlaps with Embodiment 1 is omitted and the description of Embodiment 1 is employed.

Figure 8:
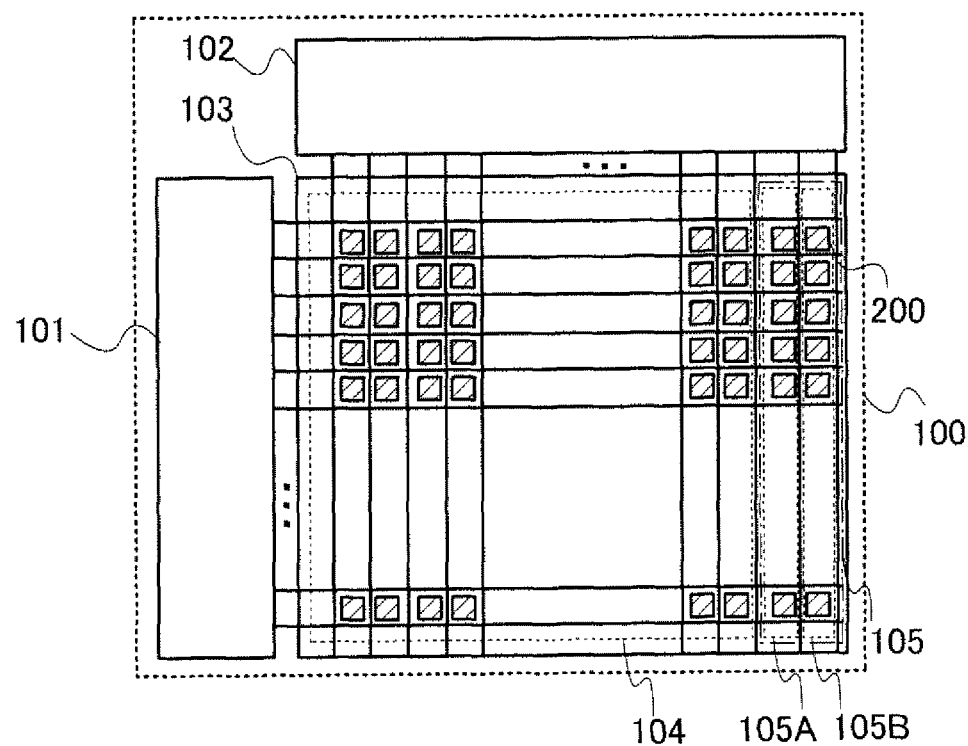
FIG. 8 is a block diagram illustrating Embodiment 2.

FIG. 8 specifically illustrates the memory cells in the memory cell region and the test region in FIG. 1B. The semiconductor device 100 illustrated in FIG. 8 includes the row decoder 101, the column decoder 102, and the semiconductor memory circuit 103 including the memory cell region 104 and the test region 105 as in FIG. 1B. The memory cell region 104 and the test region 105 include the memory cells 200 arranged in matrix. As an example, FIG. 8 illustrates a structure in which the memory cells 200 are arranged in a grid pattern.

Note that the description of the memory cell region 104, a structure of the memory cell 200, and a driving method of the semiconductor device 100 are the same as those in Embodiment 1.

Figure 9:
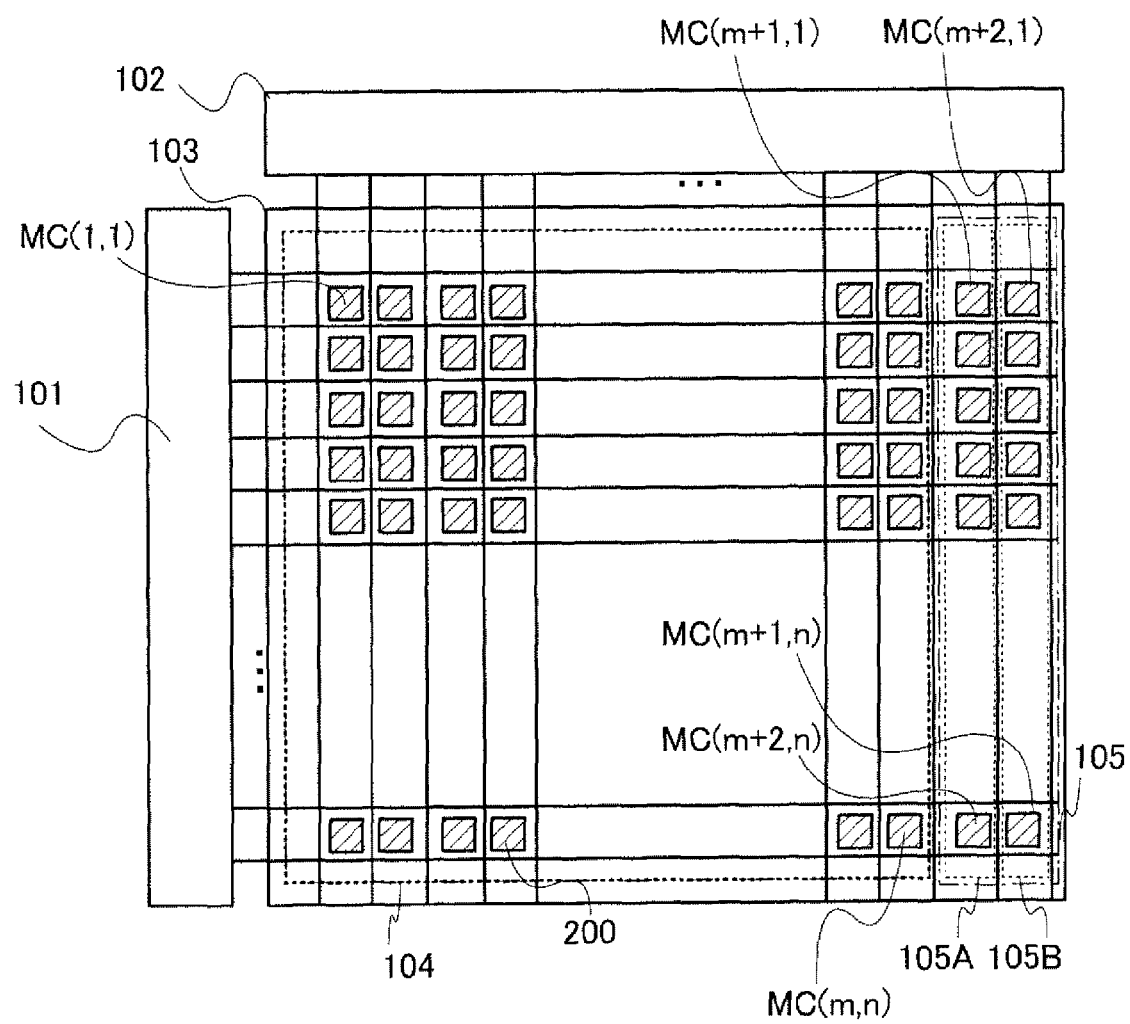
FIG. 9 is a block diagram illustrating Embodiment 2.

Note that as illustrated in FIG. 9, the first region 105A and the second region 105B of the test region 105 are different from those in Embodiment 1 in that the first region 105A for holding the first storage state and the second region 105B for holding the second storage state are separately provided in a column direction.

By providing the first region 105A and the second region 105E in a column direction, reading from a memory cell MC (1, 1) of the first column can be performed at the same time as reading from a memory cell MC (m+1, 1) of the first region of the test region and a memory cell MC (m+2, 1) of the second region of the test region. Since data is written for every row, whether writing to the memory cell region is an error or not can be judged more accurately by the first region 105A and the second region 105B.

Note that this embodiment can be combined with other embodiments as appropriate.

Embodiment 3

In this embodiment, a semiconductor memory device according to one embodiment of the present invention will be described.

Figure 10:
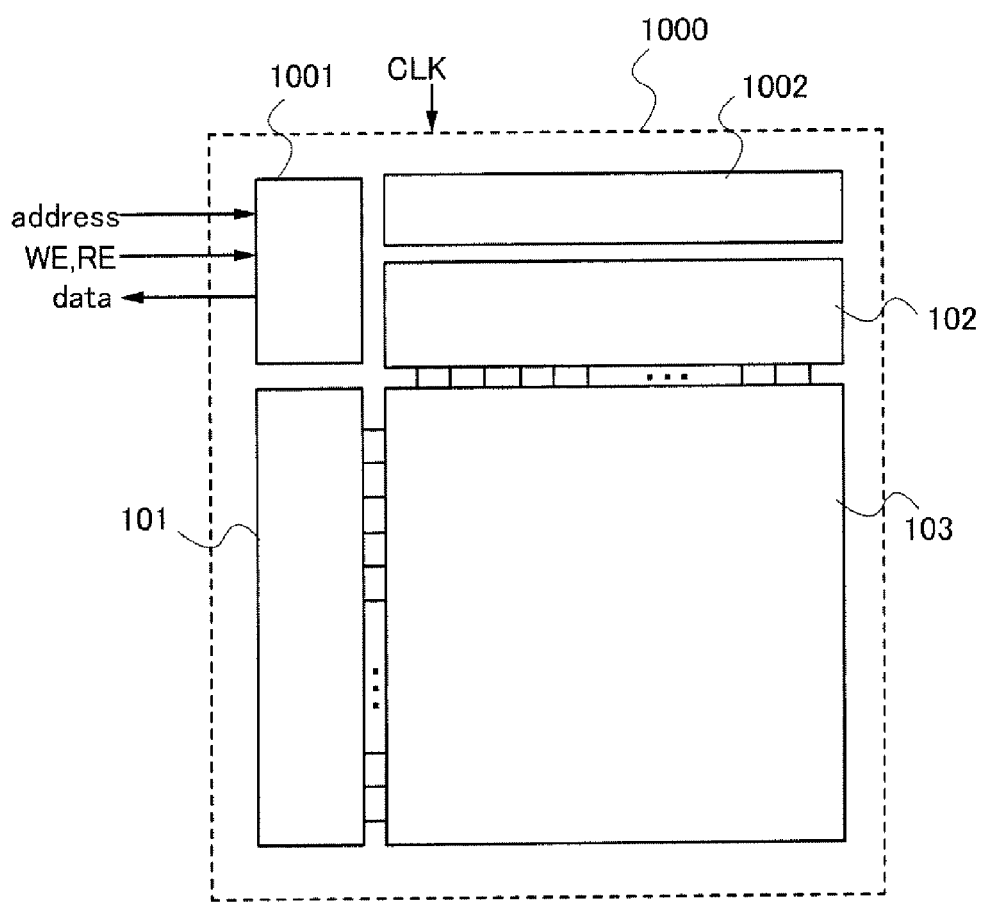
FIG. 10 is a block diagram illustrating Embodiment 3.

An example of a structure of the semiconductor device described in the above embodiment is illustrated in FIG. 10.

In addition, FIG. 10 illustrates each signal input and output as well as a block diagram of the semiconductor device described in Embodiment 1. A semiconductor device 1000 illustrated in FIG. 10 includes an interface portion 1001, a boosting circuit 1002, the row decoder 101, the column decoder 102, and the semiconductor memory circuit 103.

Note that the semiconductor memory circuit 103 includes the memory cell region and the test region as in the above embodiment. To the interface portion 1001, address data (address) of the memory cell region and the test region in the semiconductor memory circuit 103, a writing control signal (WE), and a reading control signal (RE) are input from the outside of the semiconductor device 1000. Further, data (data) read from the memory cell region and the test region of the semiconductor memory circuit 103 is output to the outside of the semiconductor memory circuit 103. Furthermore, the boosting circuit 1002 includes a charge pump circuit and generates a voltage level required for writing data to the semiconductor memory circuit 103. Moreover, a clock signal (CLK) and a power supply voltage (VDD or VSS) are input to the semiconductor memory device 1000 and the semiconductor memory device 1000 operates.

Note that it is advantageous that transistors, particularly thin film transistors (TFTs) are used for a logic circuit, a switching element, or the like forming the interface portion 1001, the boosting circuit 1002, the row decoder 101, the column decoder 102, and the semiconductor memory circuit 103, because the semiconductor device can be formed at low cost as compared to the case of using a single crystal silicon substrate.

Note that this embodiment can be combined with other embodiments as appropriate.

Embodiment 4

In this embodiment, a wireless communication device will be described as an application example of the semiconductor device described in the above embodiments.

A wireless communication device in this embodiment includes a semiconductor memory circuit, stores information which is necessary for the semiconductor memory circuit, and exchanges information with the outside by using contactless means, for example, wireless communication. With this feature, the wireless communication device is applied to, for example, an individual authentication system in which individual information of an object or the like is stored and the object is recognized by reading the information, for example. In order to use the wireless communication device for such an application, higher reliability is necessary because data on individual information is stored to recognize an object.

Figure 11:
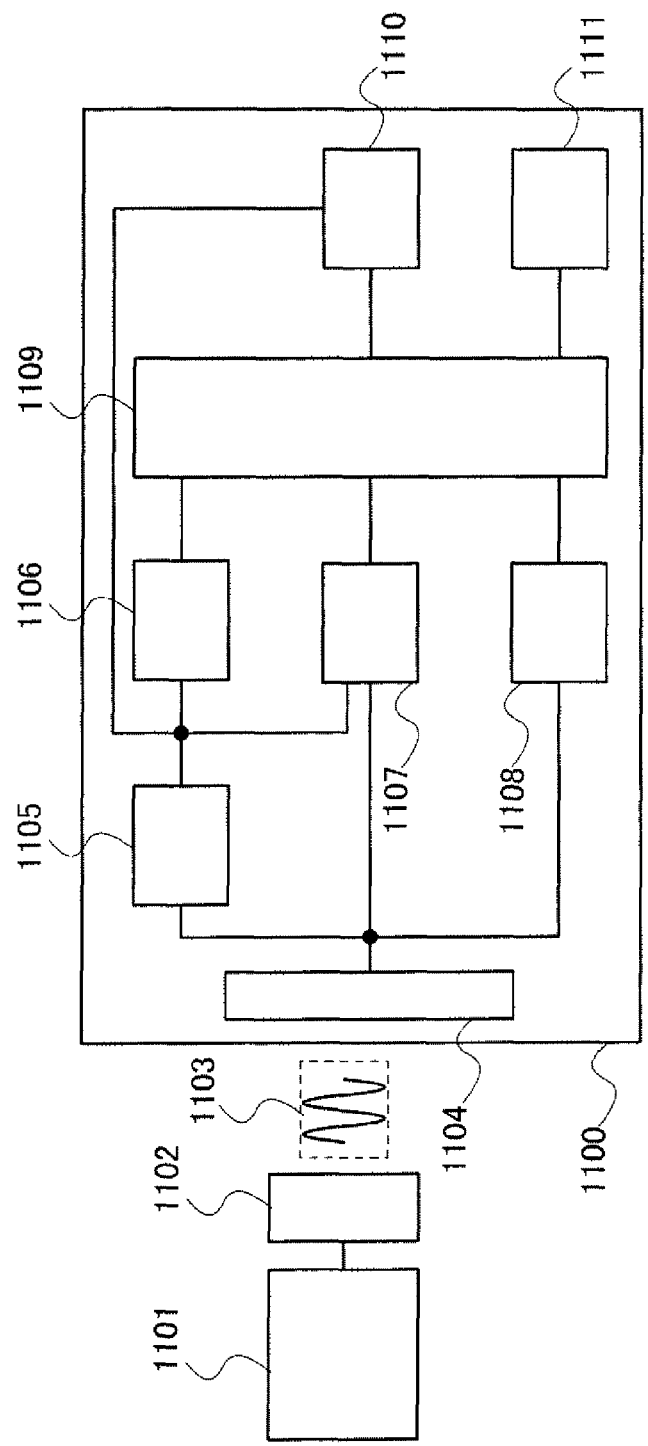
FIG. 11 is a block diagram illustrating Embodiment 4.

A structure of the wireless communication device is described with reference to FIG. 11. FIG. 11 is a block diagram illustrating the structure of the wireless communication device.

As illustrated in FIG. 11, a wireless communication device 1100 includes an antenna 1104 which receives a radio signal 1103 transmitted from an antenna 1102 connected to a reader/writer (also referred to as an interrogator) 1101. Further, the wireless communication device 1100 includes a rectifier circuit 1105, a constant voltage circuit 1106, a demodulation circuit 1107, a modulation circuit 1108, a logic circuit 1109, a semiconductor device 1110, and a ROM 1111. Note that the semiconductor device 1110 includes the semiconductor memory circuit provided with the memory cell region and the test region as in the above embodiments. Note that data transmission methods are roughly classified into the following three methods: an electromagnetic coupling method by which a pair of coils is provided so as to face each other and communicates with each other by mutual induction, an electromagnetic induction method by which communication is performed using an induction field, and a radio wave method by which communication is performed using a radio wave. Any of these methods can be used in this embodiment.

Next, the structure of each circuit is described. The antenna 1104 transmits and receives the radio signal 1103 to/from the antenna 1102 connected to the reader/writer 1101. In addition, the rectifier circuit 1105 generates an input potential by rectification, for example, half-wave voltage doubler rectification of an input alternating signal generated by reception of a radio signal at the antenna 1104 and smoothing of the rectified signal with a capacitor element provided in a subsequent stage.

Note that a limiter circuit may be provided on an input side or an output side of the rectifier circuit 1105. The limiter circuit controls electric power so that electric power which is higher than or equal to certain electric power is not input to a circuit in a next stage if the amplitude of the input alternating signal is high and an internal generation voltage is high. Further, the constant voltage circuit 1106 generates a stable power supply voltage from an input potential and supplies it to each block.

Furthermore, the constant voltage circuit 1106 may include a reset signal generation circuit. The reset signal generation circuit generates a reset signal of the logic circuit 1109 by utilizing a rise of the stable power supply voltage. Further, the demodulation circuit 1107 demodulates the input alternating signal by envelope detection and generates a demodulated signal.

Furthermore, the logic circuit 1109 analyzes and processes the demodulated signal. The semiconductor device 1110 includes a row decoder, a column decoder, and a semiconductor memory circuit which are described in the above embodiments. The semiconductor device 1110 can judge whether a storage state held in a non-volatile memory element is correct or not in the case where accumulation or discharge of charges in/from a charge accumulation layer is not performed sufficiently. Therefore, defects of reading wrong data can be reduced.

Further, the ROM 1111 stores an identification number (ID) and outputs it in accordance with the processing. Note that the ROM 1111 may be provided as needed. Furthermore, the modulation circuit 1108 modulates data output from the antenna 1104.

In this embodiment, a semiconductor device described in the above embodiments can be provided as the semiconductor device 1110 of the wireless communication device 1100. Therefore, whether a storage state held in a non-volatile memory element is correct or not can be judged in the case where accumulation or discharge of charges in/from a charge accumulation layer is not performed sufficiently. Therefore, defects of reading wrong data can be reduced.

Note that this embodiment can be combined with other embodiments as appropriate.

Embodiment 5

A manufacturing method of a semiconductor device of this embodiment is described with reference to FIGS. 12A to 12D, FIGS. 13A to 13D, and FIG. 14. In this embodiment, cross-sectional views of a non-volatile memory transistor Tm and a switching transistor Ts are illustrated for describing a manufacturing method thereof.

Note that although a MONOS type non-volatile memory transistor is described in this embodiment, a floating-gate (FG) type non-volatile memory transistor may be used.

Figure 12A:
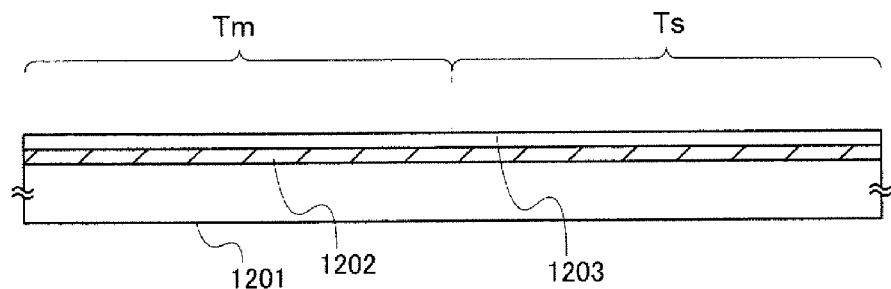
FIGS. 12A to 12D are cross-sectional views illustrating Embodiment 5.

First, as illustrated in FIG. 12A, a base insulating film 1202 is formed over a substrate 1201. A glass substrate, a quartz substrate, a ceramic substrate, a metal substrate (e.g., a stainless steel substrate), or the like may be used as the substrate 1201. The base insulating film 1202 can be formed by a CVD method, a sputtering method, or the like so as to have a single-layer structure or a stacked structure formed of an insulating material such as silicon oxide, silicon nitride, silicon nitride oxide, and silicon oxynitride.

Next, a semiconductor film 1203 is formed over the base insulating film 1202. In order to form the semiconductor film 1203, for example, an amorphous semiconductor film which contains silicon (Si) as its main component may be formed by a sputtering method, an LPCVD method, a PECVD method, or the like, and the amorphous semiconductor film may be crystallized to form a crystalline semiconductor film. In the case where an SOI substrate is used as the substrate 1201, a semiconductor layer of the SOI substrate serves as the semiconductor film 1203 and an insulating layer under the semiconductor layer serves as the base insulating film 1202.

Figure 12B:
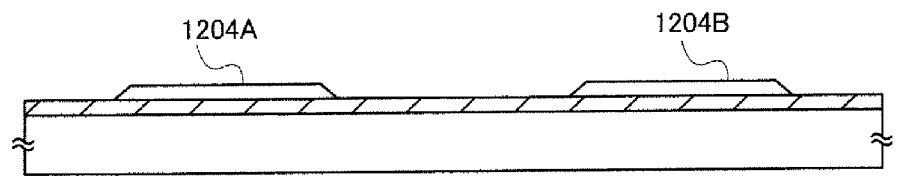

Next, as illustrated in FIG. 12B, the semiconductor film 1203 is etched to have an island shape, so that semiconductor films 1204A and 1204B are formed. The semiconductor films 1204A and 1204B are films forming semiconductor regions of the non-volatile memory transistor Tm and the switching transistor Ts, respectively.

Then, an insulating film with a thickness of 10 nm to 50 nm is formed to cover the semiconductor films 1204A and 1204B. The insulating film is formed by an LPCVD method, a PECVD method, or the like so as to be a single-layer film or a stacked-layer film formed of silicon oxide, silicon nitride, silicon nitride oxide, and silicon oxynitride.

Figure 12C:
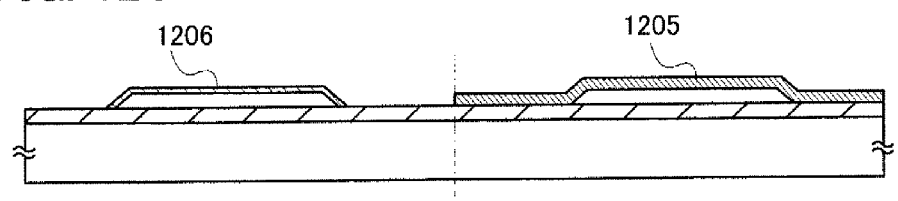

Next, the insulating film is selectively removed. Then, as illustrated in FIG. 12C, a surface of the semiconductor film 1204A is exposed and an insulating film 1205 which covers the semiconductor film 120413 is formed. A manufacturing process of the insulating film 1205 is as follows: a portion in which an insulating film 1206 is to be formed is covered with a resist and the other portion is removed by etching.

Next, as illustrated in FIG. 12C, the insulating film 1206 is formed over the semiconductor film 1204A. The insulating film 1206 serves as a first insulating film of the non-volatile memory transistor Tm. The insulating film 1206 is preferably formed to have a thickness of 1 nm to 10 nm by performing heat treatment, plasma treatment, or the like on the semiconductor film 1204A.

Figure 12D:
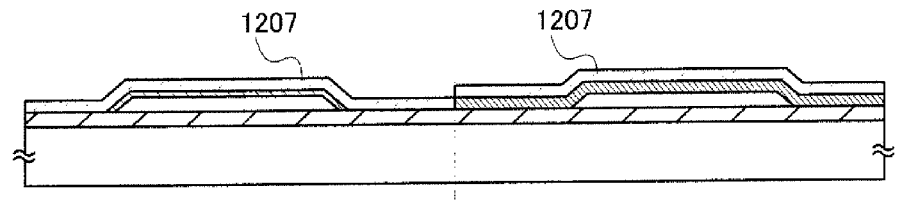

Then, as illustrated in FIG. 12D, a silicon nitride film 1207 is formed to cover the semiconductor films 1204A and 1204B. The silicon nitride film 1207 can be formed by a PECVD method using a mixed gas of $NH_3$ and $SiH_4$ as a process gas.

Figure 13A:
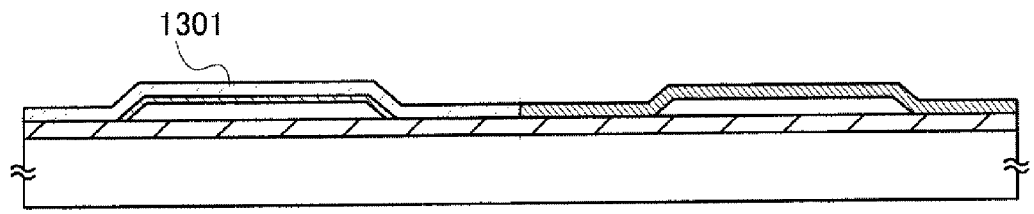
FIGS. 13A to 13D are cross-sectional views illustrating Embodiment 5.

Then, as illustrated in FIG. 13A, a charge accumulation layer is formed over the semiconductor film 1204A by etching the silicon nitride film 1207 subjected to nitriding treatment.

Figure 13B:
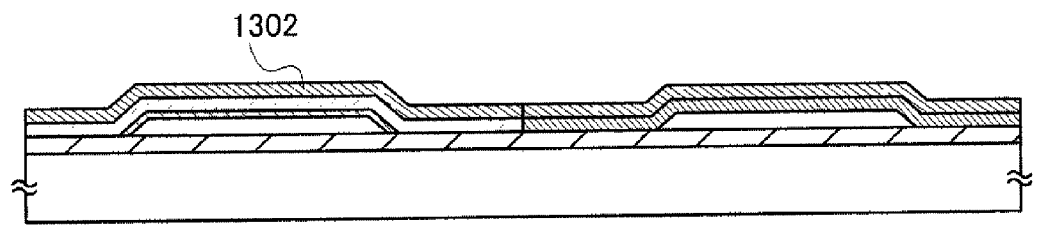

Next, as illustrated in FIG. 13B, an insulating film 1302 is formed over the insulating film 1205 and the silicon nitride film 1207. The insulating film 1302 serves as a second insulating film of the non-volatile memory transistor Tm. For example, in the case where the insulating film 1302 is formed as a single layer, a silicon oxynitride film is formed to have a thickness of 5 nm to 50 nm by a CVD method.

Figure 13C:
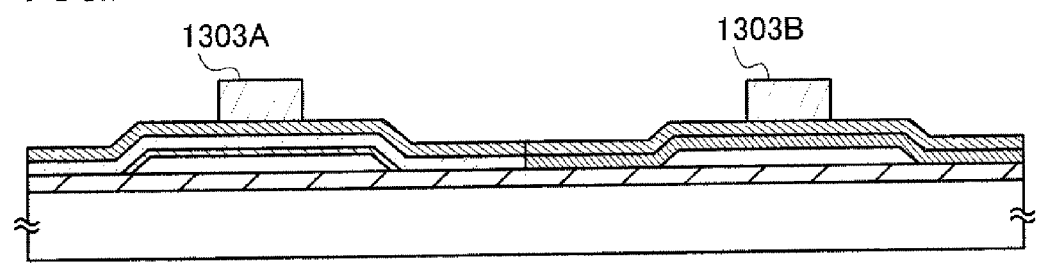

Then, as illustrated in FIG. 13C, a conductive film formed over the insulating film 1302 is etched to form a conductive film 1303A overlapping with the semiconductor film 1204A and a conductive film 1303B overlapping with the semiconductor film 1204B. The conductive film 1303A serves as a gate electrode of the non-volatile memory transistor Tm and the conductive film 1303B serves as a gate electrode of the switching transistor Ts. The conductive films 1303A and 1303B can be formed to have a single-layer structure or a multi-layer structure having two layers or more; for example, the conductive films 1303A and 1303B can be formed of a stacked layer film of a tantalum nitride film and a tungsten film.

Figure 13D:
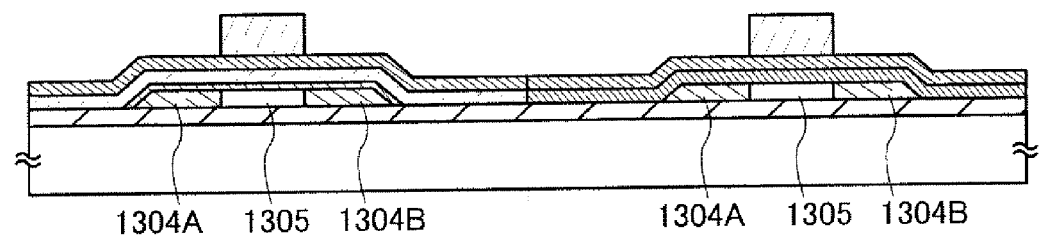

Next, as illustrated in FIG. 13D, with the conductive films 1303A and 1303B used as a mask, an impurity element imparting n-type or p-type conductivity is added to the semiconductor films 1204A and 1204B, so that a channel formation region 1305 and impurity regions 1304A and 1304B are formed. As an impurity element imparting n-type conductivity, P (phosphorus) or As (arsenic) may be used. As an impurity element imparting p-type conductivity, B (boron) may be used.

Figure 14:
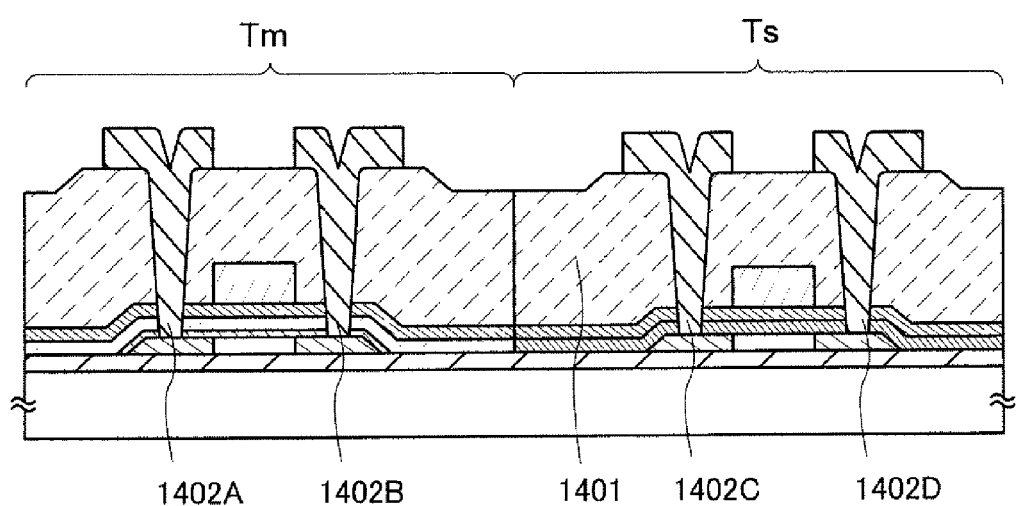
FIG. 14 is a cross-sectional view illustrating Embodiment 5.

Then, as illustrated in FIG. 14, an insulating film 1401 is formed to cover the conductive films 1303A and 1303B. Opening portions are formed in the insulating films 1401, 1302, 1301, 1205, and 1206, and parts of the impurity regions 1304A and 1304B are exposed. Conductive films 1402A to 1402D connected to the impurity regions 1304A and 13043 formed in the semiconductor films 1204A and 1204B are formed over the insulating film 1401.

The insulating film 1401 can be formed to have a single-layer structure or a stacked-layer structure. As an insulating film forming the insulating film 1401, an inorganic film formed of a material such as silicon oxide, silicon nitride, silicon nitride oxide, and silicon oxynitride or a film formed of an organic material such as polyimide can be formed by a CVD method, a sputtering method, or the like.

The conductive films 1402A to 1402D can be formed to have a single-layer structure or a stacked-layer structure. The conductive films 1402A to 1402D are formed using a conductive material such as a single metal element selected from aluminum (Al), tungsten (W), titanium (Ti), tantalum (Ta), molybdenum (Mo), nickel (Ni), platinum (Pt), copper (Cu), gold (Au), silver (Ag), manganese (Mn), and neodymium (Nd); or an alloy material or compound material containing any of these elements as its main component, by a CVD method, a sputtering method, or the like.

Through the above steps, a semiconductor device in which the non-volatile memory transistor Tm and the switching transistor Ts are formed over the same substrate 1201 can be manufactured.

Note that this embodiment can be combined with other embodiments as appropriate.

Embodiment 6

In this embodiment, one example of applications of the wireless communication device provided with the semiconductor device described in Embodiment 4, will be described.

Figure 15A:
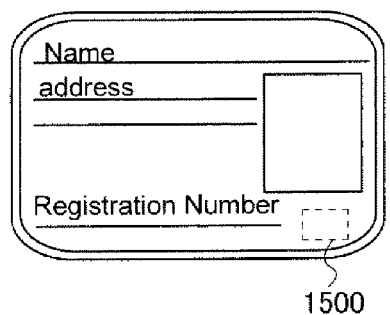
FIGS. 15A to 15F are views illustrating Embodiment 6.
Figure 15B:
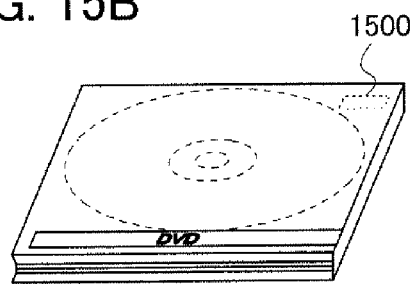
Figure 15C:
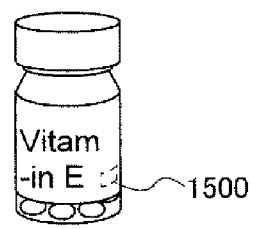
Figure 15D:
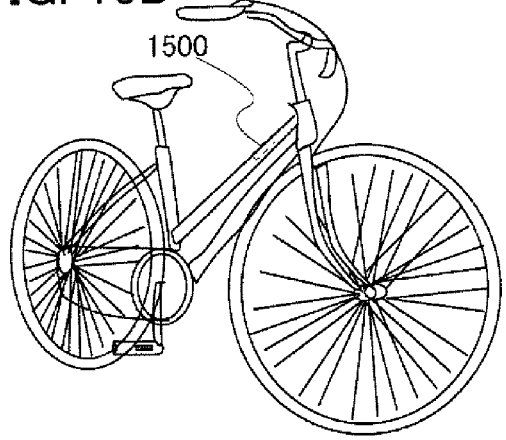
Figure 15E:
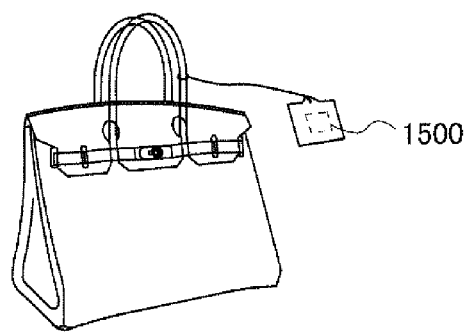
Figure 15F:
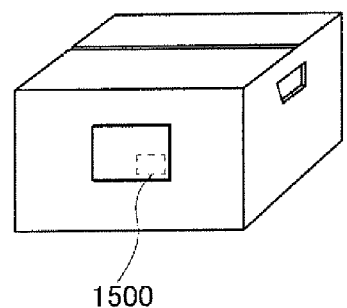

As illustrated in FIGS. 15A to 15F, the wireless communication device can be employed for a wide range of applications and can be provided in, for example, objects such as bills, coins, securities, bearer bonds, certificates (e.g., driver's licenses and resident cards, see FIG. 15A), containers for wrapping (e.g., wrapping paper and bottles, see FIG. 15C), recording media (e.g., DVD software and video tapes, see FIG. 15B), vehicles (e.g., bicycles, see FIG. 15D), personal belongings (e.g., bags and glasses), foods, plants, animals, human bodies, clothes, daily commodities, and electronic devices (e.g., liquid crystal display devices, EL display devices, television units, and mobile phones), and tags attached to a product (see FIGS. 15E and 15F).

A wireless communication device 1500 is fixed to an object by being mounted on a printed board, being attached to a surface, or being embedded in the object. For example, the wireless communication device 1500 is embedded in paper of a book or an organic resin of a package to be fixed to each object. Since the wireless communication device 1500 achieves a reduction in size, thickness, and weight, the attractive design of the object itself is not spoiled even after the wireless communication device is fixed to the object. In addition, when the wireless communication device 1500 is provided for bills, coins, securities, bearer bonds, certificates, or the like, an authentication function can be provided, and forgery thereof can be prevented by utilizing the authentication function. Further, when the wireless communication device 1500 is attached to containers for wrapping, recording media, personal belongings, foods, clothes, daily commodities, electronic devices, or the like, a system such as an inspection system can be efficiently performed. Furthermore, when the wireless communication device 1500 is attached to vehicles, safety against theft or the like can be increased.

As described above, by using the wireless communication device including a semiconductor device for the applications given in this embodiment, in the case where accumulation or discharge of charges in a charge accumulation layer is not performed sufficiently, whether a storage state held in a non-volatile memory element is correct or not is judged and defects of reading wrong data can be decreased. Therefore, authentication and reliability of security of an object can be improved.

Note that this embodiment can be combined with another embodiment as appropriate.

This application is based on Japanese Patent Application serial no. 2009-229404 filed with the Japan Patent Office on Oct. 1, 2009, the entire contents of which are hereby incorporated by reference.

What is claimed is:

1. A driving method for a semiconductor device comprising:
    performing a first operation for writing memory data to memory cells in a memory cell region for storing data of a first storage state or a second storage state, writing test data to memory cells in at least one of a first region and a second region for storing a predetermined data; the first region and the second region are provided in a test region,
    performing a second operation for reading the test data from the at least one of the first region and the second region;
    performing a third operation for reading the memory data from the memory cell; and
    judging whether the third operation is correctly performed or not in accordance with whether the first test data read from the at least one of the first region and the second region agree with the predetermined data,
    wherein a control circuit writes or reads data to/from the memory cell region and the test region.

2. A driving method for a semiconductor device according to claim 1,
    wherein the control circuit comprises a row decoder and a column decoder,
    wherein the column decoder comprises a plurality of bit lines,
    wherein the memory cells in the first region is connected to one of the plurality of bit lines, and the memory cells in the second region is connected to another one of the plurality of the hit lines.

3. A driving method for a semiconductor device according to claim 1,
    wherein the control circuit comprises a row decoder and a column decoder,
    wherein the row decoder comprises a plurality of word lines,
    wherein the memory cells in the first region and the second region are connected to one of the plurality of word lines.

4. The driving method of the semiconductor device according to claim 1,
    wherein the memory cell comprises a switching transistor and a non-volatile memory transistor; and
    wherein a power supply voltage generated based on a radio signal received by an antenna is supplied to a wiring which is provided for driving the switching transistor and the non-volatile memory transistor.

5. A driving method for a semiconductor device comprising:
    performing a first operation for writing memory data to memory cells in a memory cell region for storing data of a first storage state or a second storage state, writing first test data to memory cells in a first region and second test data to memory cells in a second region for storing a first predetermined data and a second predetermined data, respectively; the first region and the second region are provided in a test region,
    performing a second operation for reading the first test data from the first region and the second test data from the second region;
    performing a third operation for reading the memory data from the memory cell; and
    judging whether the third operation is correctly performed or not in accordance with whether the first test data and the second test data in the second operation agree with the first predetermined data and the second test data, respectively,
    wherein a control circuit writes or reads data to/from the memory cell region and the test region.

6. A driving method for a semiconductor device according to claim 5,
    wherein the control circuit comprises a row decoder and a column decoder,
    wherein the column decoder comprises a plurality of bit lines,
    wherein the memory cells in the first region is connected to one of the plurality of bit lines, and the memory cells in the second region is connected to another one of the plurality of the bit lines.

7. A driving method for a semiconductor device according to claim 5,
    wherein the control circuit comprises a row decoder and a column decoder,
    wherein the row decoder comprises a plurality of word lines,
    wherein the memory cells in the first region and the second region are connected to one of the plurality of word lines.

8. The driving method of the semiconductor device according to claim 5,
    wherein the memory cell comprises a switching transistor and a non-volatile memory transistor; and
    wherein a power supply voltage generated based on a radio signal received by an antenna is supplied to a wiring which is provided for driving the switching transistor and the non-volatile memory transistor.

* * * * *

UNITED STATES PATENT AND TRADEMARK OFFICE
CERTIFICATE OF CORRECTION

PATENT NO. : 8,437,194 B2  
APPLICATION NO. : 12/892121  
DATED : May 7, 2013  
INVENTOR(S) : Toshihiko Saito Page 1 of 1

It is certified that error appears in the above-identified patent and that said Letters Patent is hereby corrected as shown below:

In the Specification:

Col. 1, line 56, "in the ease" should read "in the case"

Col. 1, line 62, "in the ease of a first" should read "in the case of a first"

Col. 4, line 28, "second region 10513" should read "second region 105B"

Col. 7, line 50, "second region 105E" should read "second region 105B"

Col. 10, line 52, "105E in a column direction" should read "105B in a column direction"

Col. 13, line 39, "semiconductor film 120413" should read "semiconductor film 1204B"

Col. 14, line 26, "impurity regions 1304A and 13043" should read "impurity regions 1304A and 1304B"

In Claims:

Claim 2, col. 15, line 10, "plurality of the hit lines." should read "plurality of the bit lines."

Signed and Sealed this  
Third Day of September, 2013

Teresa Stanek Rea  
*Acting Director of the United States Patent and Trademark Office*